United States Patent
Adams et al.

(10) Patent No.: US 6,273,107 B1
(45) Date of Patent: Aug. 14, 2001

(54) POSITIVE FLOW, POSITIVE DISPLACEMENT RINSE TANK

(75) Inventors: Darrell E. Adams, Caddo Mills; Michael D. Butler, Richardson; Kim A. Blake, Garland, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/206,078

(22) Filed: Dec. 4, 1998

Related U.S. Application Data
(60) Provisional application No. 60/067,619, filed on Dec. 5, 1997.

(51) Int. Cl.$^7$ ............................................ B08B 3/02
(52) U.S. Cl. ........................ 134/102.1; 134/102.2; 134/199; 134/186; 134/902
(58) Field of Search ....................... 134/902, 172, 134/173, 186, 94.1, 99.1, 100.1, 102.1, 102.2, 199; 68/183; 261/122

(56) References Cited

U.S. PATENT DOCUMENTS

| | | | |
|---|---|---|---|
| 3,799,179 | * 3/1974 | Thomas . | |
| 4,342,326 | * 8/1982 | Meier | 134/102.1 |
| 4,599,966 | * 7/1986 | Lymn | 134/199 |
| 4,633,893 | 1/1987 | McConnell et al. | 134/95 |
| 4,997,490 | 3/1991 | Vetter et al. | 134/26 |
| 5,000,795 | * 3/1991 | Chung et al. | 134/37 |
| 5,014,727 | * 5/1991 | Aigo | 134/102 |
| 5,069,235 | * 12/1991 | Vetter et al. | 134/113 |
| 5,071,488 | * 12/1991 | Takayama et al. | 134/34 |
| 5,415,191 | * 5/1995 | Mashimo et al. | 134/102.1 |
| 5,443,942 | * 8/1995 | Imamura . | |
| 5,451,267 | * 9/1995 | Stadler et al. . | |
| 5,482,068 | * 1/1996 | Kitahara et al. | 134/182 |
| 5,503,171 | * 4/1996 | Yokomizo et al. | 134/182 |
| 5,520,205 | * 5/1996 | Guldi et al. | 134/98.1 |
| 5,531,236 | * 7/1996 | Kempka et al. | 134/182 |
| 5,656,097 | 8/1997 | Oleson et al. | 134/1 |
| 5,671,764 | 9/1997 | Murakami et al. | 134/200 |

(List continued on next page.)

FOREIGN PATENT DOCUMENTS

| | | | |
|---|---|---|---|
| 53-144265 | * 12/1978 | (JP) | 134/902 |
| 58-61632 | * 4/1983 | (JP) | 134/902 |
| 4-192419 | * 7/1992 | (JP) | 134/902 |

*Primary Examiner*—Frankie L. Stinson
(74) *Attorney, Agent, or Firm*—Mark A. Valetti; Wade James Brady, III; Frederick J. Telecky, Jr.

(57) ABSTRACT

The improved rinse tank includes an external shell and an internal shell. For one embodiment, the external shell preferably defines a five sided open-top tank with a top open to the atmosphere. The internal shell is preferably disposed within the external shell and has a configuration that will accommodate at least two semiconductor wafer boats filled with six inch semiconductor wafers. The external shell is preferably sized large enough to completely immerse the wafer boat and wafers in water when the rinse tank is filled. A chamber may be formed between the external shell and the internal shell within the lower portion of the rinse tank. Two or more deionized water inlets may be provided at the bottom of the rinse tank at opposite corners. Three or more compressed air nozzles may also be provided at the lower portion of the rinse tank. Multiple deionized water jet ports are provided at the internal shell. When the rinse tank is filled with water and compressed air is allowed to enter the chamber, deionized water is forced through the deionized water jet ports giving the associated water jet both a velocity and a direction. Deionized water jets are then directed across the surface of each wafer, to clean or rinse the wafers.

14 Claims, 3 Drawing Sheets

U.S. PATENT DOCUMENTS

| | | | |
|---|---|---|---|
| 5,674,357 | 10/1997 | Sun et al. ............................... | 156/659 |
| 5,674,410 | * 10/1997 | Nakajima et al. . | |
| 5,697,391 | * 12/1997 | Sewaga ............................. | 134/102.2 |
| 5,730,162 | * 3/1998 | Shindo et al. .......................... | 134/66 |
| 5,839,456 | * 11/1998 | Han .................................... | 134/104.1 |
| 5,845,660 | * 12/1998 | Shindo et al. ...................... | 134/56 R |
| 5,849,091 | * 12/1998 | Skrovan et al. ......................... | 134/1 |
| 5,992,431 | * 11/1999 | Weber et al. ......................... | 134/902 |
| 6,054,062 | * 4/2000 | Calio et al. . | |

* cited by examiner

POSITIVE FLOW, POSITIVE DISPLACEMENT RINSE TANK

This application claims priority under 35 USC §119(e)(1) of provisional application No. 60/067,619 filed Dec. 5, 1997.

TECHNICAL FIELD OF THE INVENTION

The present invention relates generally to methods and apparatus for cleaning semiconductor wafers, and more particularly to an improved rinse tank.

BACKGROUND OF THE INVENTION

Integrated circuits are manufactured from semiconductor substrates, or wafers, on which transistors, resistors, diodes and other electrical circuit elements are formed. The production of integrated circuits involves a multitude of processing procedures performed on semiconductor wafers. One such process whereby ions are implanted on semiconductor wafers is the reactive ion etch (RIE) process. It is quite important in semiconductor manufacturing that particulates formed upon a semiconductor within one manufacturing process be completely removed prior to a subsequent manufacturing process. Traditionally, the wafers are cleaned and rinsed prior to and subsequent to each procedure. Cleaning and rinsing is required in order to stop the chemical reaction that occurs during etching and to remove the etchant chemical or other contaminant matter from the wafer surface. The complete removal of particulate residue from semiconductor substrates will enhance the functionality and reliability of the completed integrated circuits.

Methods by which wafers may be rinsed with deionized water are common to the art. These methods include static water overflow baths, quick dump rinse (QDR) baths and processes whereby additional energy is introduced to the bath through ultrasonic or megasonic agitation. Another method involves bubbling air or gas from the bottom of the tank across the surface of the wafers and relying on convection currents to agitate the water molecules and facilitate water molecule interaction with the face of the wafer. A recent study has indicated that as little as 20% of the water within such tanks makes contact with the wafers.

Additionally, the traditional cleaning and rinsing methods do not adequately remove particulate matter from the tank itself. When particulate contaminates and etching chemicals have bonded with deionized water molecules during removal from the surface of a wafer or substrate, they tend to cling to the sides and corners of the associated rinse tank. This is particularly true of QDR tanks.

Furthermore, as the size of semiconductor wafers increases, water consumption in rinsing and cleaning steps has increased exponentially. Larger wafers require larger tanks which tend to waste additional deionized water. Traditional cleaning and rinsing methods are often inefficient, consume too much deionized water, and waste time.

SUMMARY OF THE INVENTION

Accordingly, a need has arisen in the art for an improved rinse tank for use in cleaning semiconductor wafers or substrates. The present invention provides a rinse tank that substantially eliminates or reduces problems associated with the prior rinse tanks.

In accordance with one aspect of the present invention, a positive flow, positive displacement (hereinafter "PFPD") rinse tank is provided with an external shell having five generally closed sides and an open top. An internal shell may also be provided within a lower portion of the tank. The internal shell is preferably provided with a configuration to receive wafer boats through the open top of the rinse tank. The internal shell may be sized to support two wafer boats. Each wafer boat may be filled with semiconductor wafers or substrates. When filled with water, the external shell is preferably sized large enough to completely immerse the wafer boats and wafers in water.

More specifically, in accordance with teachings of the present invention, two deionized water inlets may be provided at the bottom of the external shell, preferably at opposite corners. The deionized water inlets allow the rinse tank to be filled with deionized water while maintaining approximately equal hydrostatic force throughout the tank. Three compressed air fittings may also be provided at the bottom of the external shell. The compressed air fittings may be attached to three-eighth inch polypropylene tubing. Compressed air may be introduced into the polypropylene tubing and forced into the bottom of the rinse tank in the area between the external shell and the internal shell. The compressed air may be provided at a pressure of approximately fifty-six pounds per square inch.

In another embodiment of the present invention the internal shell may be provided with a plurality of small deionized water jet ports. The jet ports allow a mixture of water and air to be transferred from a chamber between the internal shell and the external shell to the open bath. As deionized water and compressed air are added to the chamber, the fluid pressure is increased and the mixture of deionized water and air is forced through the jet ports across the face of the wafers.

In still another embodiment of the present invention, a method for cleaning and rinsing semiconductor wafers is provided, including the steps of immersing a wafer boat with semiconductor wafers into a tank filled with deionized water, such that the semiconductor wafers are fully immersed in deionized water and introducing compressed gas into a chamber occupying a bottom portion of the tank. The chamber is preferably perforated with a plurality of jet ports to direct deionized water fluid flow across the surface of the semiconductor wafers. The resulting pressurized water jets contact the surface of the wafers for a predetermined amount of time to remove any loose particles, chemicals or any other undesired contaminants from the surface of the wafers.

Technical advantages of the present invention include providing a more efficient rinse tank to clean and rinse wafers in such a manner as to force as much as ninety-eight percent of the deionized water in the associated rinse tank across the surface of each wafer being rinsed. The rinse tank is designed to add velocity and direction to deionized water jets and results in much greater water to wafer contact, increasing the overall efficiency of the rinse cycle.

Another technical advantage of the present invention includes providing a reduced size rinse tank which conforms to the shape of the associated wafer boat. By decreasing the volume of the rinse tank, less deionized water is required per rinse cycle. Furthermore, by increasing the efficiency and decreasing the overall size of the rinse tank, the cleaning and rinsing processes are accomplished in less time than conventional methods associated with rinsing and cleaning semiconductor wafers.

Other technical advantages will be readily apparent to one skilled in the art from the following figures, descriptions and claims.

DESCRIPTION OF THE DRAWINGS

For a more complete understanding of the present invention and its advantages thereof, reference is now made to the following brief description, taken in conjunction with the accompanying drawings and detailed description, wherein like reference numerals represent like parts, in which.

DETAILED DESCRIPTION OF THE INVENTION

Figure 1:
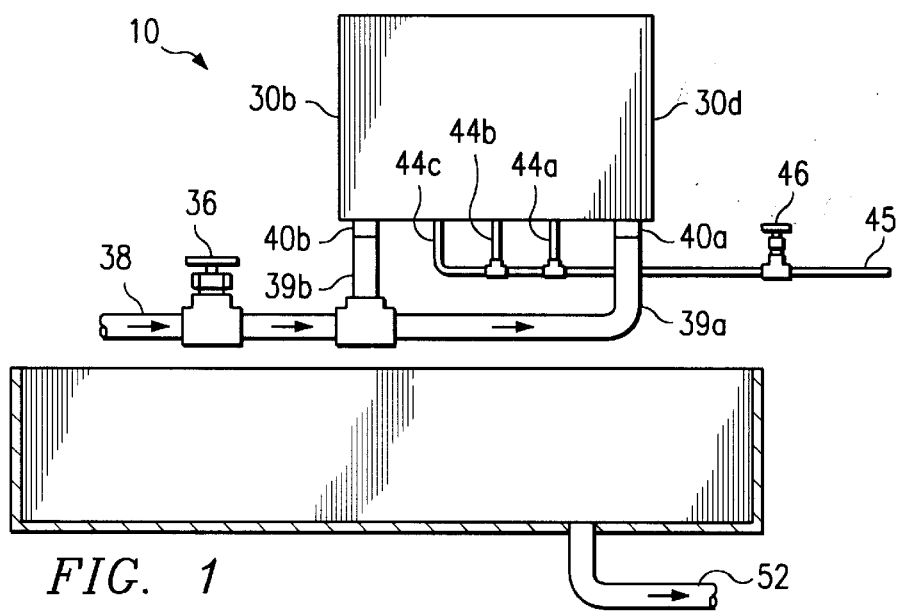
FIG. 1 is a schematic drawing in elevation with portions broken away which illustrate an exemplary embodiment of the present invention.

The preferred embodiments of the present invention and its advantages are best understood by referring now in more detail to FIGS. 1–5 of the drawings, in which like numerals refer to like parts.

For purposes of the present application, the term "wafer" is used to refer to any semiconductor wafer substrate used in the semiconductor fabrication industry, including silicon wafers.

For purposes of the present application, the term "wafer boat" is used to refer to any carrying device which either supports, spaces or arranges wafers for processing during semiconductor fabrication.

As shown in the drawings for purposes of illustration, the present invention is embodied in rinse tank 10 which conforms to the shape of a semiconductor wafer boat 12. For one application, rinse tank 10 will generally have the capacity to support and process two wafer boats 12 at a time. Each wafer boat 12 will preferably support twenty-five semiconductor wafers 14. However, rinse tank 10 can be modified to accept any number of wafer boats 12 and wafer boats 12 can be modified to accept any number of semiconductor wafers 14. Rinse tank 10 includes chamber 24 in which a selected gas and liquid can mix to produce pressurized liquid streams 28. Liquid streams 28 are directed from jet ports 26 across the surface of adjacent wafers 14.

Figure 2:
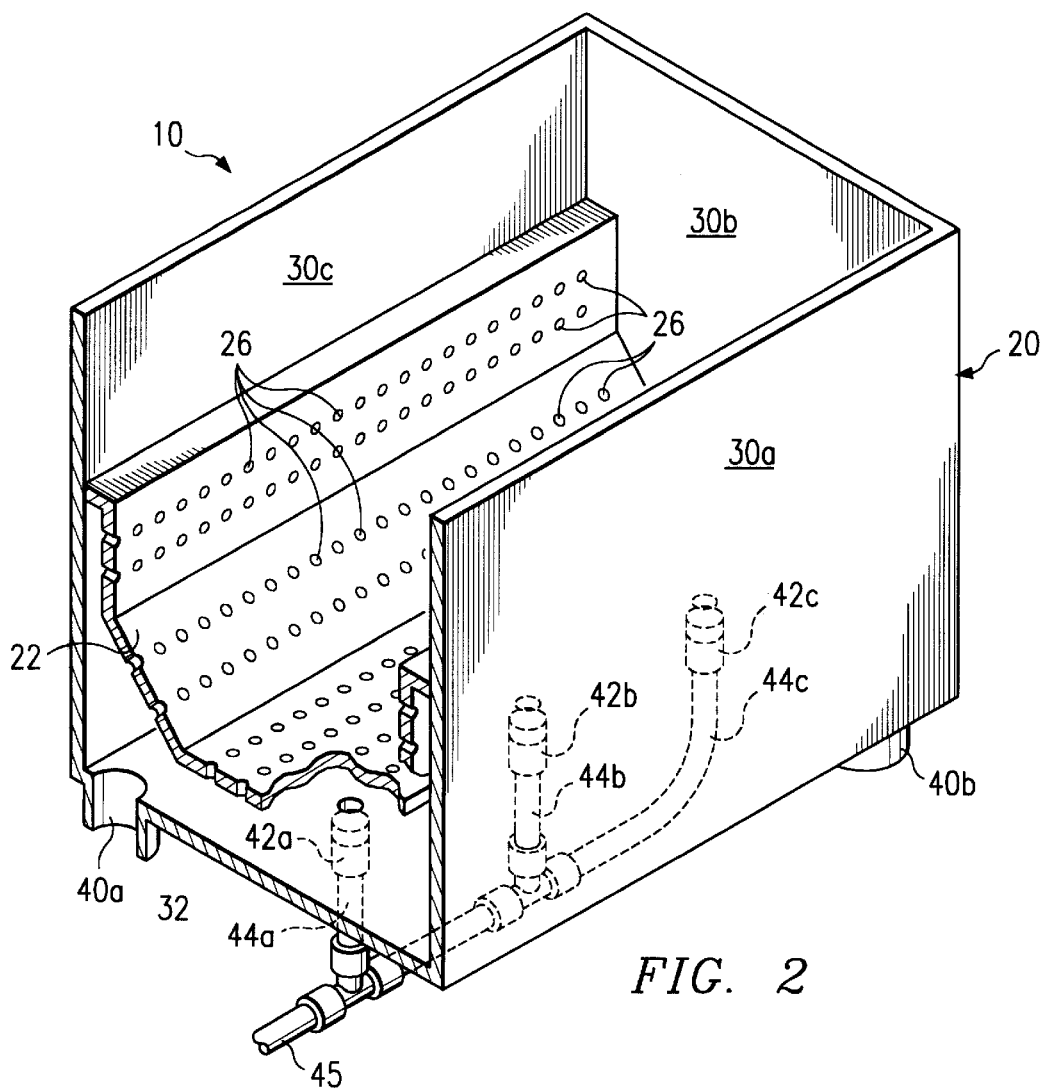
FIG. 2 is an isometric drawing with portions broken away illustrating the rinse tank of FIG. 1.
Figure 3:
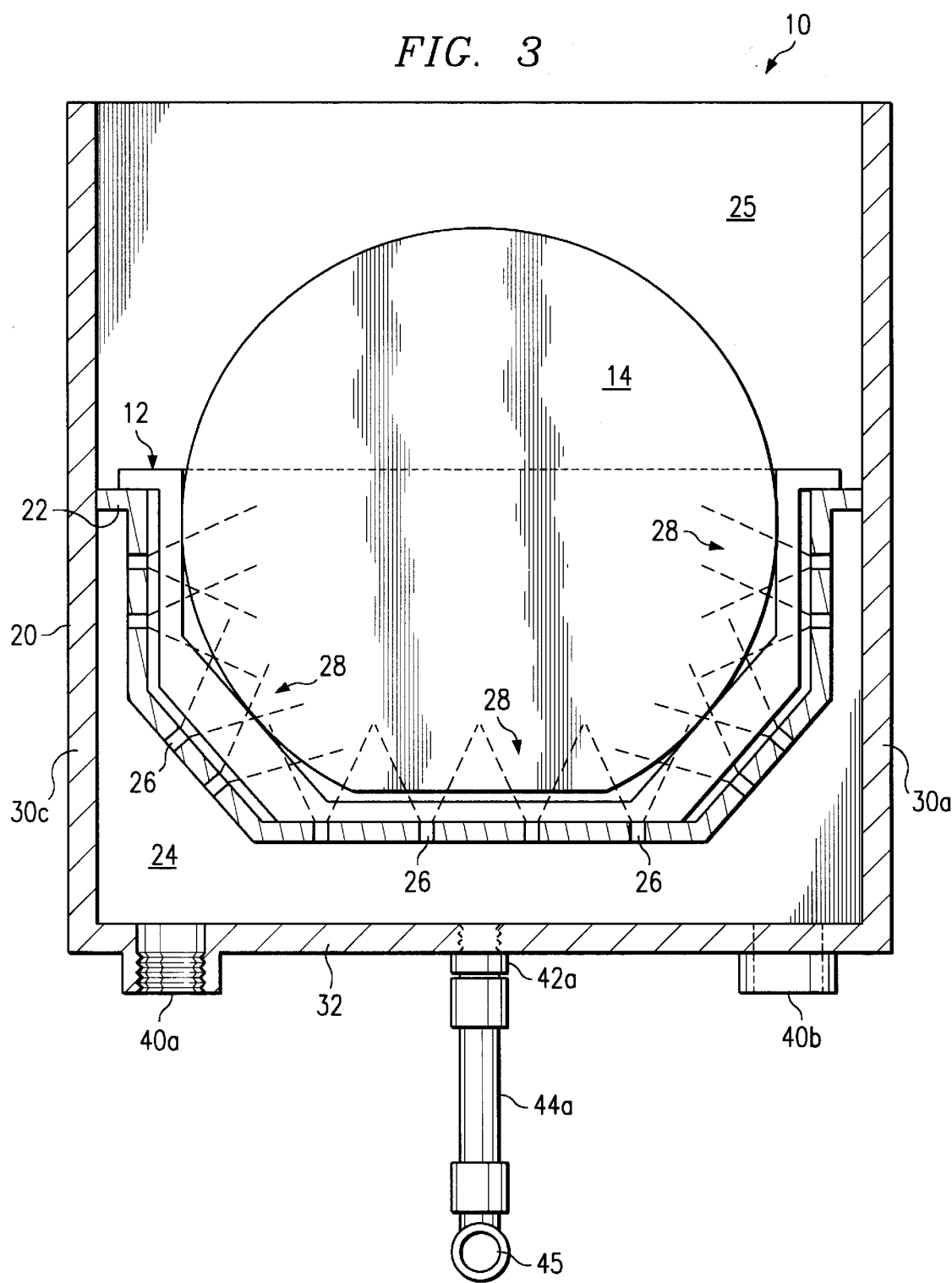
FIG. 3 is a schematic drawing in section, with portions broken away, illustrating the rinse tank of FIG. 2 with a wafer boat and semiconductor wafer disposed therein.
Figure 4:
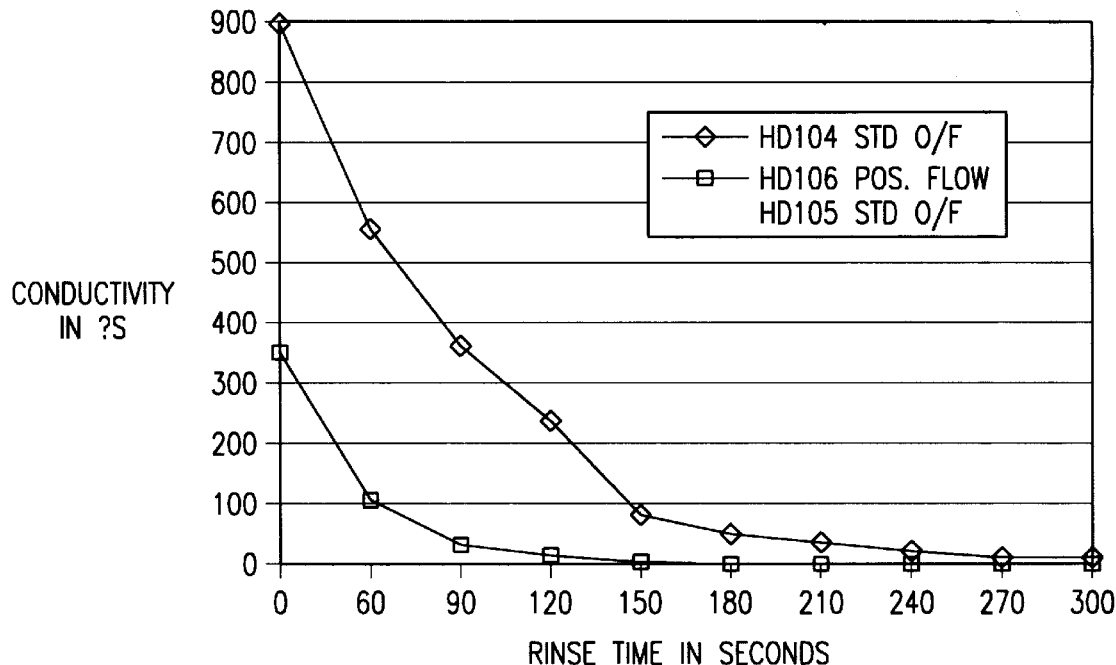
FIG. 4 is a graph representing the conductivity of deionized water as a function of time during wafer rinsing operations using a standard overflow tank and a PFPD rinse tank.
Figure 5:
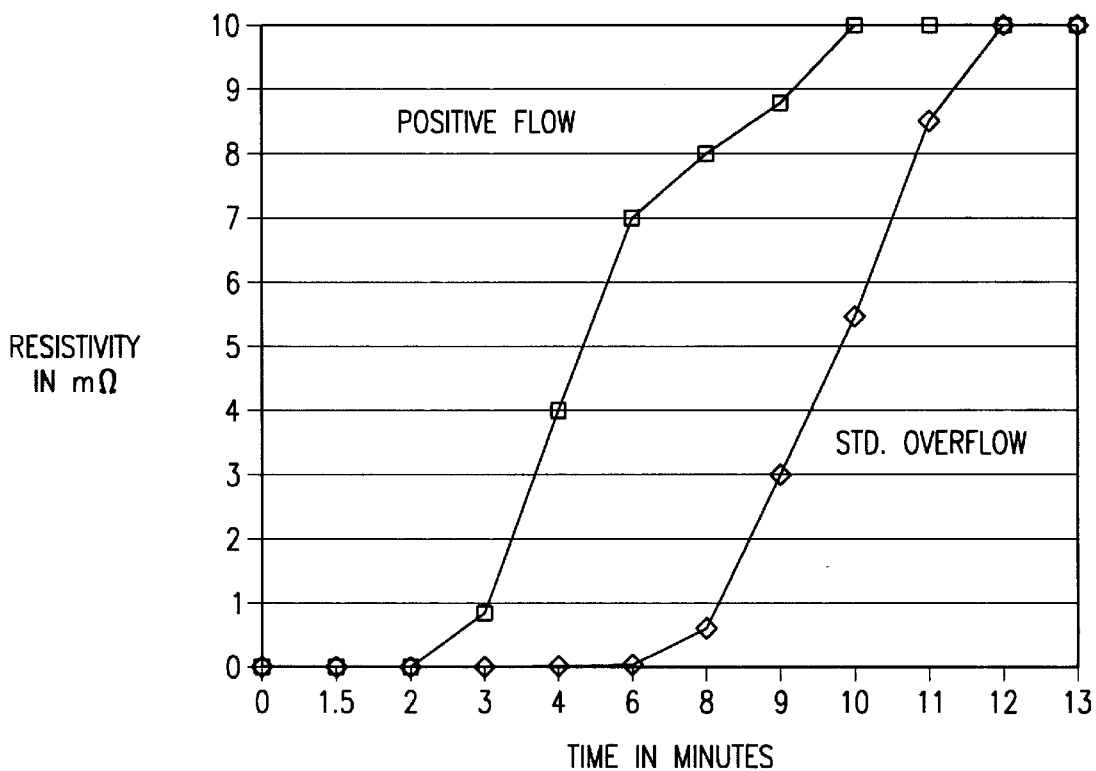
FIG. 5 is a graph representing the resistivity of the deionized water as a function of time during wafer rinsing operations using a standard overflow tank and a PFPD rinse tank.

Referring to FIGS. 1, 2 and 3, rinse tank 10 is provided. Rinse tank 10 includes an external shell 20 and internal shell 22. For one embodiment of the present invention, external shell 20 and internal shell 22 may be fabricated from clear polypropylene. External shell 20 includes four sides 30a, 30b, 30c and 30d, and bottom 32. The top of external shell 20 is open to the atmosphere. Internal shell 22 has a generally U-shaped configuration and partitions rinse tank 10 into two sections, chamber 24 and open bath 25. The shape and size of internal shell 22 is selected to allow internal shell 22 to support at least one wafer boat 12 filled with semiconductor wafers 14. For the embodiment shown in FIGS. 2 and 3, internal shell 22 and wafer boat 12 may be described as having a semi-octagonal cross section.

External shell 20 is preferably sized large enough to allow wafers 14 to be completely immersed in deionized water when wafer boat 12 is disposed within internal shell 22. Although the preferred embodiment of the present invention is constructed to accommodate six-inch semiconductor wafers 14, rinse tank 10 can be modified to accept any size semiconductor wafer, including four-inch and eight-inch wafers.

Two deionized water inlets 40a and 40b are preferably provided in bottom 32 of external shell 20, at opposite corners. Water inlets 40a and 40b are provided to allow rinse tank 10 to be filled from bottom 32. The number and configuration of water inlets 40a and 40b are selected to allow for equal hydrostatic force to be maintained horizontally across rinse tank 10, during filling operations. Although the preferred embodiment of the present invention includes two (2) one-half inch water inlets 40a and 40b, any number and size water inlets can be used within the teachings of the present invention.

A one-half inch diameter main water supply line 38 is provided with branch water lines 39a and 39b connecting to rinse tank 10 at water inlets 40a and 40b respectively. Water valve 36 is provided within main water supply line 38 to control the flow of deionized water to rinse tank 10. Water valve 36 preferably has three pre-set positions allowing for varying degrees of deionized water flow. In the "closed" position, water valve 36 will prevent deionized water from entering rinse tank 10. Also, in the closed position, water valve 36 will prevent rinse tank 10 from being drained by the force of gravity, through water inlets 40 and branch water lines 39a and 39b. In the "low flow" position, water valve 36 allows a flow of approximately 0.1 gallons per minute of deionized water to rinse tank 10. During the cleaning phase of wafer processing only, water valve 36 is placed in a "high flow" position, which delivers approximately three gallons of deionized water per minute to rinse tank 10.

Three gas ports 42a, 42b and 42c are provided near the center of bottom 32 of external shell 20. Three-eighth inch plastic tube branch gas lines 44a, 44b and 44c are connected to gas ports 42a, 42b and 42c respectively. A solenoid gas valve 46 is provided at main gas line 45. When a pressurized gas such as compressed air is required for rinsing or cleaning operations, solenoid gas valve 46 is opened to allow for a steady flow of pressurized gas to rinse tank 10. Otherwise, solenoid gas valve 46 is typically in the closed position. Although compressed air is generally utilized in the preferred embodiment of the present invention, any pressurized gas, including nitrogen gas ($N_2$), can be used within the teachings of the present invention.

Chamber 24 is formed between internal shell 22 and external shell 20. Chamber 24 is defined by bottom 32 and side walls 30a, 30b, 30c and 30d of external shell 20 and internal shell 22. Internal shell 22 is preferably perforated with multiple jet ports 26. Jet ports 26 are geometrically aligned within internal shell 22 such that liquid stream 28, through each jet port 26, is directed across the face of an adjacent semiconductor wafer 14. Liquid stream 28 includes a mixture of gas and liquid. Liquid stream 28 exits from each jet port 26. For one embodiment, liquid streams 28 are a mixture of filtered compressed air and deionized water. Other fluid and/or gas mixtures may be formed in chamber 24 and directed through jet ports 26 to contact the surface or face of adjacent wafers 14.

Where necessary, jet ports 26 are angled to ensure direct contact between each liquid stream 28 and the adjacent wafer 14. The orientation of jet ports 26 correspond with the vectors of the resulting liquid streams 28. In the preferred embodiment of the present invention, there are approximately 800 water jet ports 26 within internal shell 22, and the diameter of each water jet port 26 is approximately one-sixteenth of an inch.

To begin the cleaning or rinsing operation, semiconductor wafer boat 12 is filled with semiconductor wafers 14 and inserted into rinse tank 10. Wafer boat 12 is supported by internal shell 22 such that wafer boat 12 and wafers 14 will be completely immersed in deionized water when rinse tank 10 is filled. Next, water valve 36 is opened to a "low flow" position to allow deionized water to flow through main water supply line 38 and branch water lines 39a and 39b at a rate of approximately 0.1 gallons per minute. Deionized water will then pass through water inlets 40a and 40b filling rinse tank 10 with deionized water. When rinse tank 10 is completely filled, water will continue to flow through water inlets 40a and 40b causing rinse tank 10 to overflow from the top of exterior shell 20. All of the deionized water flowing out of the top of rinse tank 10 will preferably be collected in overflow plenum 50. Overflow plenum 50 is provided to collect the deionized water runoff as rinse tank 10 is overflowed. Waste deionized water is drained from overflow plenum 50 through industrial waste drain 52 where waste deionized water is disposed of appropriately. Waste deionized water may also be recycled and re-used accordingly, within the teachings of the present invention.

As long as water valve 36 remains in the "low flow" position water will continue to flow to rinse tank 10 causing overflow. In this condition, wafers 14 within wafer boat 12 will be continually rinsed with deionized water and any chemicals or contaminants removed from wafers 14 will be removed from the tank within the overflowed deionized water. This "low flow" condition permits a rinsing of wafers 14 and a continuous replenishment of deionized water to rinse tank 10. "Low flow" is not intended to clean the semiconductor wafers 14 but rather provide a continuous rinse cycle.

Next, water valve 36 is placed in the "high flow" position which delivers approximately 3.0 gallons per minute of deionized water to rinse tank 10. The increased amount of water allows for a stronger flow through rinse tank 10 and a more rapid replenishment of deionized water. During this stage, contaminants are removed from rinse tank 10 at a faster rate than the "low flow" position.

When more abrasive cleaning of semiconductor wafers 14 is required, solenoid gas valve 46 within main gas line 45 is actuated to an "open" position. Solenoid gas valve 46 has two pre-set positions allowing for the flow of a selected pressurized gas to rinse tank 10. Solenoid gas valve 46 can be placed in the "closed" position which will prevent any pressurized gas from reaching rinse tank 10. When solenoid gas valve 46 is placed in the "open" position, pressurized gas will be delivered to rinse tank 10 at a pressure of approximately fifty-six pounds per square inch. Pressurized gas is forced into chamber 24 beneath internal shell 22. As the pressure within chamber 24 is increased, deionized water is forced through deionized water jet ports 26. In this manner, the pressurized gas fills chamber 24 and the pressure within chamber 24 rises above the pressure in open bath 25 portion of rinse tank 10. The increase in pressure within chamber 24 forces a mixture of pressurized gas such as compressed air and deionized water through each jet ports 26 contained within internal shell 22. Cooperation between the flow of pressurized gas and deionized water into chamber 24 creates liquid streams 28 exiting from respective jet ports 26. Jet ports 26 are positioned in such a manner that each liquid stream 28 will be forced across the surface of an adjacent semiconductor wafer 14. Jet ports 26 are also angled where necessary to ensure a direct path of deionized water across the surface of wafer 14. In the preferred embodiment of the present invention, the velocity of the mixture of compressed air and deionized water through the jet ports is approximately twenty centimeters per second.

As the deionized water is forced into contact with the surface of wafer 14, the deionized water molecules bond with contaminates and etching chemicals. The deionized water will accomplish the dual function of stopping the etching process by removing the etchant chemical from the surface of the wafer, and cleaning the surface of wafer 14 of impurities. The deionized water molecules will ionize with any particles with an electro negative constant.

In one embodiment of the present invention, a method of measuring the chemical properties of the deionized water within rinse tank 10 is employed. The chemical properties to be monitored may include the conductivity and/or the resistivity of the deionized water within rinse tank 10. By monitoring the chemical properties of the deionized water within rinse tank 10, the amount of particulate matter contaminates within rinse tank 10 can be measured. In this manner, the chemical properties of the deionized water within rinse tank 10 can be used to determine when the semiconductor wafers within rinse tank 10 have been adequately cleaned and rinsed.

The semi-octagonal shape of internal shell 22 as well as the number, position, and angle of water jet ports 26 accommodate the rapid removal of contaminants from the surface of wafers 14 and rinse tank 10. Water jet ports 26 are directed toward the face of the wafers as well as toward the center of the open top of rinse tank 10. In this manner, particulate matter and etching chemicals are removed from the face of wafers 14 and carried directly to the top of rinse tank 10 where they are overflowed into overflow plenum 50 and disposed of through industrial waste drain 52. The speed and direction of liquid streams 28 also prevent the accumulation of particulate matter on the sides and in the corners of rinse tank 10.

The substantial savings in deionized water costs are readily apparent through a comparison with conventional methods. The typical QDR tank uses approximately 47 gallons of water to complete a standard rinse cycle. The conventional overflow type rinse tank uses approximately 40 gallons to complete a standard rinse cycle. By utilizing the PFPD rinse tank, deionized water usage is reduced to approximately 9 gallons per standard rinse cycle. At a price of approximately $12 per thousand gallons of deionized water, the financial return for utilizing the PFPD rinse tank instead of conventional methods can range from approximately $0.456 to $0.372 per standard rinse cycle.

The amount of time involved in semiconductor wafer processing is also substantially reduced. The PFPD rinse tank will complete an average rinse cycle in approximately 3 minutes. A conventional overflow tank will take approximately five minutes and a QDR tank will take an average of 12 minutes to complete the same task.

An additional advantage of the present invention includes its versatility within existing semiconductor processing facilities. For example, as the size of semiconductor wafers 14 is increased, the size of the wafer rinse tank 10 has traditionally been increased. The larger rinse tank 10 requires the replacement of the wet benches (not shown) within semiconductor processing facilities. A new wet bench costs between $250,000–$1,000,000 to purchase and an additional $80,000–100,000 to install. Due to the reduced size of the PFPD rinse tank, existing wet benches designed for the processing of six-inch wafers will accept a PFPD rinse tank capable of processing wafer boats filled with larger wafers, including eight-inch wafers, without any substantial modifications.

Although the present invention and its advantages have been described in detail, it should be understood that various changes, substitutions, and alterations can be made therein without departing from the spirit and scope of the invention as defined by the appended claims.

What is claimed is:

1. An apparatus for treating semiconductor wafers with a jet flow of fluid, comprising:

a rinse tank having an interior shell disposed therein, said interior shell being sized to support a wafer boat with semiconductor wafers in said wafer boat; said interior shell having sides and a bottom;

a chamber within the rinse tank formed by said rinse tank and said interior shell for mixing a gas and a liquid;

a liquid inlet attached to the chamber for providing the chamber with a liquid;

a gas inlet attached to the chamber for providing the chamber with a gas; and a plurality of jet ports disposed within the interior shell for directing a jet comprising a mixture of the liquid and the gas from the chamber across a face of the semiconductor wafers, a first portion of said plurality of jet ports being disposed on said bottom of said interior surface and a second portion of said jet ports being disposed on said sides of said interior surface.

2. The apparatus of claim 1, wherein the gas inlet is connected to a source of compressed air.

3. The apparatus of claim 1, wherein the gas inlet is connected to a source of nitrogen gas.

4. The apparatus of claim 1, wherein the liquid inlet is connected to a source of deionized water.

5. The apparatus of claim 1, wherein the rinse tank further comprises:

the internal shell sized to support two wafer boats;

each wafer boat sized to support twenty-five semiconductor wafers therein.

6. The apparatus of claim 1 further comprising:

two liquid inlets are located at the bottom of the rinse tank.

7. The apparatus of claim 1 further comprising three gas inlets located at the bottom of the rinse tank.

8. An apparatus for rinsing and cleaning semiconductor wafers with deionized water, the apparatus comprising:

a five sided external shell defining an open top tank;

an internal shell disposed within the external shell and connected with four sides of the external shell, said internal shell having sides and a bottom, the internal shell cooperating with the five sides of the external shell to form a chamber within a lower portion of the tank;

a water inlet attached to the chamber and to a source of deionized water;

a gas inlet attached to the chamber; and a plurality of perforations disposed through the internal shell comprising water jet ports, said water jet ports situated on said bottom and sides of said internal shell for directing a jet comprising a mixture of said deionized water and said gas across a face of the semiconductor wafers by directing said jet from said chamber through said jet ports.

9. The apparatus of claim 8 wherein the gas inlet is connected to a source of compressed air.

10. The apparatus of claim 8 wherein the gas inlet is connected to a source of nitrogen gas.

11. The apparatus of claim 8 wherein compressed air is supplied to the gas inlet at a pressure of approximately fifty six pounds per square inch.

12. The apparatus of claim 8 wherein nitrogen gas is supplied to the gas inlet at a pressure of approximately fifty six pounds per square inch.

13. The apparatus of claim 8 wherein the mixture of deionized water and gas travels at a speed of twenty centimeters per second from the jet ports.

14. The apparatus of claim 8 further comprising the jet ports angled to direct the mixture of deionized water and gas exiting from a jet port toward a face of an adjacent semiconductor wafer.

* * * * *